(12) United States Patent
Kohyama

(10) Patent No.: US 7,537,981 B2
(45) Date of Patent: May 26, 2009

(54) SILICON ON INSULATOR DEVICE AND METHOD OF MANUFACTURING THE SAME

(75) Inventor: Yusuke Kohyama, Poughkeepsie, NY (US)

(73) Assignee: Kabuhsiki Kaisha Toshiba, Tokyo (JP)

( * ) Notice: Subject to any disclaimer, the term of this patent is extended or adjusted under 35 U.S.C. 154(b) by 36 days.

(21) Appl. No.: 11/736,232

(22) Filed: Apr. 17, 2007

(65) Prior Publication Data
US 2007/0184589 A1 Aug. 9, 2007

Related U.S. Application Data

(62) Division of application No. 10/850,106, filed on May 21, 2004, now Pat. No. 7,227,228.

(51) Int. Cl.
*H01L 21/84* (2006.01)
(52) U.S. Cl. .................. 438/151; 438/299; 438/479; 438/517; 438/592
(58) Field of Classification Search .......... 438/151, 438/299, 424, 479, 517, 592
See application file for complete search history.

(56) References Cited

U.S. PATENT DOCUMENTS

| | | | | |
|---|---|---|---|---|
| 4,998,150 | A * | 3/1991 | Rodder et al. | 257/288 |
| 5,310,689 | A | 5/1994 | Tomozane et al. | |
| 5,811,855 | A | 9/1998 | Tyson et al. | |
| 5,869,212 | A | 2/1999 | Hashimoto | |
| 6,087,242 | A | 7/2000 | Maris et al. | |
| 6,187,480 | B1 | 2/2001 | Huang | |
| 6,255,177 | B1 | 7/2001 | Fang et al. | |
| 6,417,055 | B2 | 7/2002 | Jang et al. | |
| 6,475,839 | B2 | 11/2002 | Zhang et al. | |
| 6,599,813 | B2 | 7/2003 | Beyer et al. | |

(Continued)

OTHER PUBLICATIONS

Takao Yonehara et al., Cutting Edge 2, Eltran; Novel SOI Wafer Technology, http://www.canon.com/eltran, JSAP International No. 4 (Jul. 2001).

(Continued)

*Primary Examiner*—Matthew Smith
*Assistant Examiner*—Colleen E Rodgers
(74) *Attorney, Agent, or Firm*—Oblon, Spivak, McClelland, Maier & Neustadt, P.C.

(57) ABSTRACT

An isolated semiconductor device and method for producing the isolated semiconductor device in which the device includes a silicon-on-insulator (SOI) device formed on a substrate. A dielectric film is formed on the insulator and covers the SOI device. The dielectric film may be a single film or a multilayer film. The silicon layer of the SOI device may include a channel region and source/drain regions. The SOI device may further include a gate insulator disposed on the channel region of the silicon layer, a gate disposed on the gate insulator and sidewall spacers formed a side surface of the gate. The dielectric film may also be disposed on an edge portion of the silicon layer. The device structure may further include metallization lines connecting through the isolation dielectric to the gate and to the source/drain regions. According, the method may include the steps of forming an SOI device on a substrate, and forming a device isolation dielectric film on said insulator after forming said silicon-on-insulator device. The method may also include the steps of forming a silicon-on-insulator device on a substrate, and forming a single dielectric film on said insulator and covering silicon-on-insulator device.

34 Claims, 8 Drawing Sheets

U.S. PATENT DOCUMENTS

| | | |
|---|---|---|
| 6,605,396 B2 | 8/2003 | Schroeder et al. |
| 6,630,385 B1 | 10/2003 | Yu |
| 6,667,139 B2 | 12/2003 | Fujisawa et al. |
| 6,686,247 B1 * | 2/2004 | Bohr .......................... 438/301 |
| 6,818,952 B2 | 11/2004 | Furukawa et al. |
| 6,828,630 B2 | 12/2004 | Park et al. |
| 6,952,040 B2 | 10/2005 | Chau et al. |

OTHER PUBLICATIONS

Wolf et al., Silicon Processing for the VLSI Era: Voll, Lattice Press: Sunset Beach, CA, 2000, p. 728-729, 797-799.

* cited by examiner

SILICON ON INSULATOR DEVICE AND METHOD OF MANUFACTURING THE SAME

CROSS-REFERENCE TO RELATED APPLICATIONS

This application is a division of and claims the benefit of priority under 35 U.S.C. §120 from U.S. Ser. No. 10/850,106, filed May 21, 2004. The entire contents of this application is incorporated herein by reference.

DISCUSSION OF THE BACKGROUND

1. Field of the Invention

This invention relates to the field of silicon on insulator (SOI) structures used in semiconductor devices and, in particular, to device isolation in SOI structures.

2. Background of the Invention

Silicon layers for silicon on insulator (SOI) structures have become thinner than that of previous generation SOI devices to reduce junction capacitance and to suppress history effects. Shallow trench isolation (STI) is one technique that has been used to electrically isolate devices on the SOI wafers. U.S. Pat. No. 6,599,813, the entire contents of which are incorporated herein by reference, describes the application of STI to SOI structures. As described therein, during conventional formation of shallow trenches on SOI structures, a typical STI formation process begins with formation of a pad oxide layer on top of the silicon layer of the SOI substrate, followed by deposition of a polish stop layer such as silicon nitride. Next, a trench is formed in the polish stop layer, the pad oxide layer, and the silicon layer of the SOI substrate, using conventional photolithography masking and etching techniques. A sidewall oxide may be thermally grown on the silicon sidewalls of the trench, to reduce the field emission effect. Then, the trench is filled with $SiO_2$ by, for example, a high density plasma (HDP) deposition process. Excess $SiO_2$ is removed by CMP (chemo-mechanical polishing) planarization down to the polish stop layer, and the polish stop layer is then removed.

The previously grown pad oxide layer, formed on top of the silicon layer of the SOI substrate, is removed by etching. During etching, some of the STI fill material also is inevitably removed. Next, a sacrificial oxide layer is grown on the silicon layer of the SOI structure. Well ion implants are then performed. Ion implantation of the SiO2 STI fill material is believed to cause the surface of the SiO2 to become very soft. Upon stripping of the sacrificial oxide layer, a significant amount of the softened SiO2 STI fill material may be removed, producing divots in the STI fill material. Portions of a gate oxide grown for device formation is later stripped, which leads to further etching of the STI material and formation of divots in the STI fill material.

STI fill material may also be inadvertently etched during cleaning steps. For example, an HF wet clean is needed for native oxide and/or metal contamination removal. The HF wet clean is an important step in the formation of subsequent layers to create interfaces between various components of the silicon transistor structures. For example, a cleaning step may be performed post gate etch, or prior to silicide formation. The silicon and the silicon oxide in the SOI structure, if exposed, must survive the HF wet cleans. Omission of the HF wet clean is not a viable option, as omission leads to various failures in the fabricated transistor devices, such as for example non-ohmic contact failure and/or high leakage current failure due to crystal defects. Thus, an SOI silicon thickness must accommodate the HF etching amount, which being unpredictable due to the nature of the native oxide formation limits the minimum thickness of the SOI silicon layer that must be provided.

One approach under consideration for thinner SOI layers is to use a raised source/drain (RSD) in which the source/drain regions of the transistor device on the SOI silicon layer are thicker (i.e., raised above the surface of the SOI silicon layer) than the channel layer in the transistor device. Trench isolations are then formed in between raised source drain regions of adjacent transistor devices. However, the conventional RSD technique still requires an HF cleaning step as a pre-clean prior to deposition of the silicon in the RSD regions. Accommodation of the additional HF step prior to the deposition of the silicon in the RSD regions means that the thickness of the SOI silicon layer to be utilized in the conventional RSD technique would be thicker than without RSD. Hence, even with the RSD technique, inadvertent etching of the silicon layer of the SOI structure occurs producing divots in the silicon layer.

Thus, removal of the STI fill material during the etching and cleaning steps, removal of the pad oxide exposing the silicon SOI layer, and removal of native oxides prior to RSD formation not only cause relatively large variations in STI material thickness, but also create divots in the silicon layer of the SOI structure. Further, in the progression to thinner SOI silicon layers, the present inventors have discovered that the divot depth has not become shallower because the divot depth is determined by the total amount of HF etching. As a result, the divot is expected in the near future to be deeper than the SOI silicon layer thickness.

Deep STI divots degrade not only threshold voltage variation for the transistors formed on the SOI silicon layer, but also affect manufacturing yield due to particle generation. For example, after the divot formation, the divot, whether occurring in the STI fill material or in the silicon layer of the SOI layer, can be locally filled with a film such as SiN or photoresist in a deposition/etch process. The deposition/etch process, such as for example a spacer SiN deposition and a blanket reactive ion etching of the SiN, and/or photoresist coating and development can produce local film residue in the divot. Lift off of the local film residue in the divot by a wet etching process contributes to particles, reducing manufacturing yield.

Consequently, new device isolation methods are needed. Further, as the device dimensions become smaller, strong resolution enhancement technologies, such as for example alternating phase shift mask (PSM), have become necessary. Alternating phase shift masking is known in the art and described for example in U.S. Pat. No. 6,187,480 and U.S. Pat. No. 6,605,396, the entire contents of which are incorporated herein by reference. However, the auto shifter generator method involved in PSM is restricted by complicated layouts.

SUMMARY OF THE INVENTION

In one embodiment of the device according to the present invention, there is provided a semiconductor device that includes a silicon-on-insulator (SOI) device and a single dielectric film disposed on the insulator and covering the device. The SOI device structure may further include a silicon layer, a gate insulator disposed on the silicon layer, a gate disposed on the gate insulator and source and drain regions disposed in the silicon layer. The source and drain regions may be raised source and drain regions. The SOI device may also include halo and compensation regions, and metallizations connecting through the isolation dielectric to the gate and to the source/drain regions.

According to an embodiment of the method according to the present invention, a semiconductor device is formed by a process including the steps of forming a silicon-on-insulator device on a substrate, and forming a device isolation dielectric film on the insulator after forming the silicon-on-insulator device. In a second embodiment, a semiconductor device is formed by a process including the steps of forming a silicon-on-insulator device on a substrate, and forming a single dielectric film on the insulator and covering the silicon-on-insulator device.

In another embodiment according to the present invention, a multilayer film may be formed on the insulator material and over the device.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
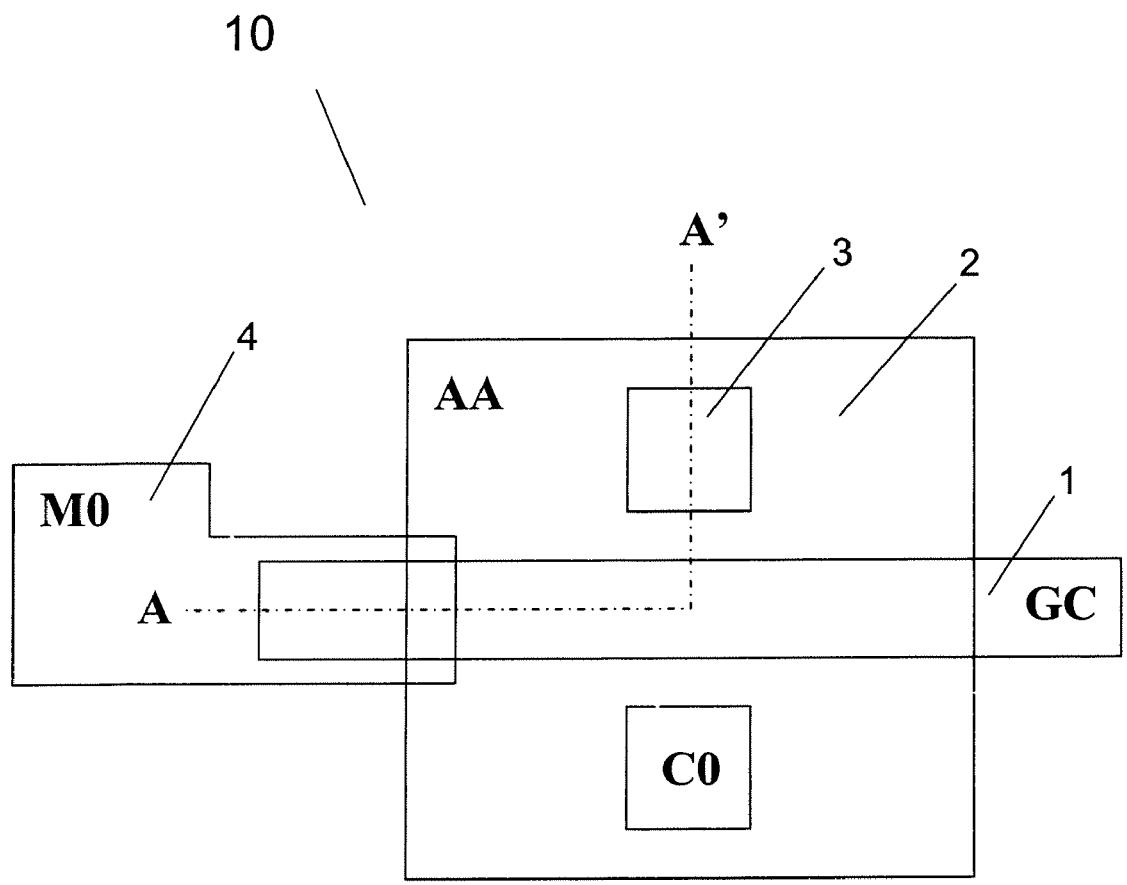
FIG. 1 is a schematic illustrating a plan view of the isolated device structure of the present invention at an early stage of completion.

Referring now to the drawings, wherein like reference numerals designate identical, or corresponding parts throughout the several views, and more particularly to FIG. 1 there is illustrated a plan view of an embodiment of the isolated semiconductor device 10 of the present invention. The device includes a gate conductor 1, an active area 2, a contact hole 3, and a gate level wire 4. Gate conductor 1 may be formed of polysilicon, or metal such as for example a silicide, TiN, and/or HfN. The silicide can be formed by a full silicidation process such as described in IEDM Tech. Dig., 2002 at p. 367, where the reaction of a metal such as Ni fully converts the polysilicon to a silicide. The gate level wire 4 can be formed from a metal such as a refractory metal. W is one example of the metal for gate level wire 4. In a preferred embodiment of the present invention, the gate conductor 1 is formed in a simple rectangular shape as depicted in FIG. 1, permitting an alternating phase shift mask to be applied for critical dimensioning of the gate conductor 1. While not restricted to submicron devices, in one preferred embodiment of the present invention, the gate conductor 1 is less than 50 nm in width and typically is in a range from 10-30 nm; the active area 2 for example represented by a channel width is less than 1000 nm and typically is in a range of 100-500 nm; the contact hole 3 is less than 200 nm and typically is in a range from 100-150 nm; and the gate level wire 4 for example represented as the width of the section connecting to the gate conductor 1 is less than 100 nm, nominally 65 nm and typically in a range from 50-75 nm.

Figure 2:
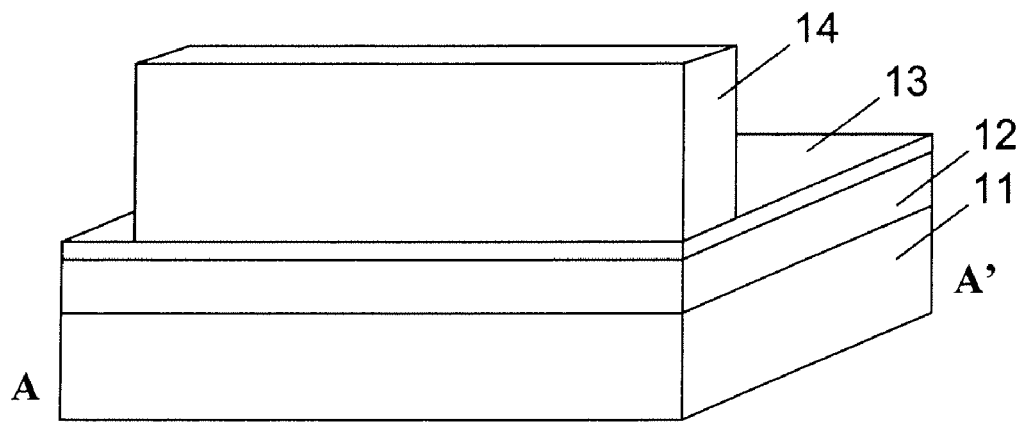
FIG. 2 is a schematic showing a perspective view of the isolated device structure of the present invention at the stage of completion depicted in FIG. 1.
Figure 3:
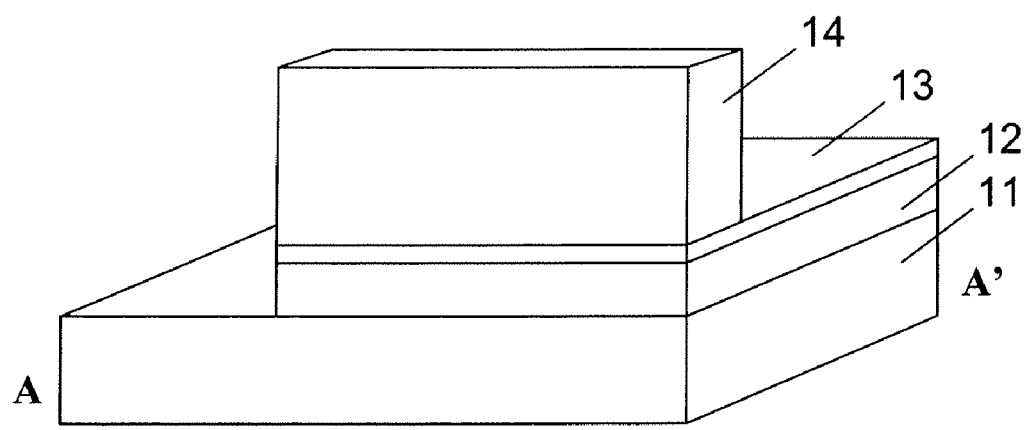
FIG. 3 is a schematic showing a perspective view of the isolated device structure of the present invention at a continuing stage of completion.

FIGS. 2-9 are perspective views illustrating a method of manufacturing the device according to the invention, and correspond to the device along the line A-A' in FIG. 1. As illustrated in FIG. 2, the silicon base substrate (not shown) has an insulated base 11, such as for example a buried oxide (BOX), or an insulating layer, formed on or in the silicon base substrate. Techniques known to those skilled in the art for the formation of buried oxide layers, such as for example oxygen ion implantation into the silicon base substrate as described in U.S. Pat. No. 5,310,689, the entire contents of which are incorporated by reference, or such as for example wafer bonding as described in U.S. Pat. No. 6,087,242, the entire contents of which are incorporated by reference, are suitable techniques for providing the silicon layer 12 and the insulated base 11 depicted in FIG. 2. SOI wafers suitable for the present invention are Eltran® SOI_EPI™ wafers as described in Int. SOI conf., 2002, p. 209 and described in ISAP International No. 4 (July 2001). Such wafers have a silicon layer thickness of about 55 nm.

A gate oxide 13 is grown on a surface of the silicon layer 12. In this example layer 12 is p-type but it also possible that layer may be n-type with appropriate changes to the doping species described below. Following growth of the gate oxide 13, a gate layer 14, preferably a heavily doped gate polysilicon layer, is deposited on the gate oxide 13 preferably as a flat gate layer. Other materials may be used such as the metal silicide, for example as described in IEDM Tech. Dig., 2002, at p. 367; TiN, for example as described in Symp. on VLSI Tech., 2003, at p. 21; and HfN, for example as described in Symp. on VLSI Tech., 2003, at p. 151. Additionally, $HfO_2$ or HfSiON, for example as described in Symp. on VLSI Tech., 2003, at p. 17, p. 19, p. 21, are also suitable for the gate dielectric of the present invention instead of silicon dioxide.

Suitable patterning using a gate conductor mask pattern forms the structure shown in FIG. 2. With further patterning using, for example, an active area mask pattern, the gate polysilicon layer 14, the gate oxide 13 and the silicon layer 12 in the gate conductor area, and the gate oxide 13 and the silicon layer 12 in the non-gate conductor area are selectively etched to form the structure shown in FIG. 3. BOX layer 11 is exposed in areas adjacent to the portions of layer 12 where the device is formed to provide for device isolation, as described below.

Figure 4:
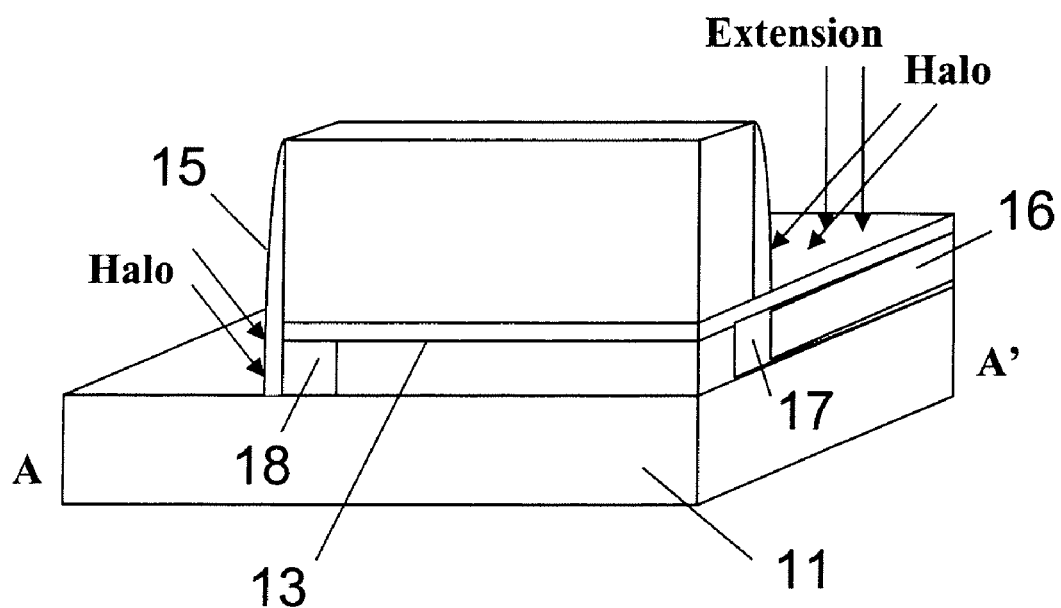
FIG. 4 is a schematic showing a perspective view of the isolated device structure of the present invention at a subsequent stage of completion.
Figure 6:
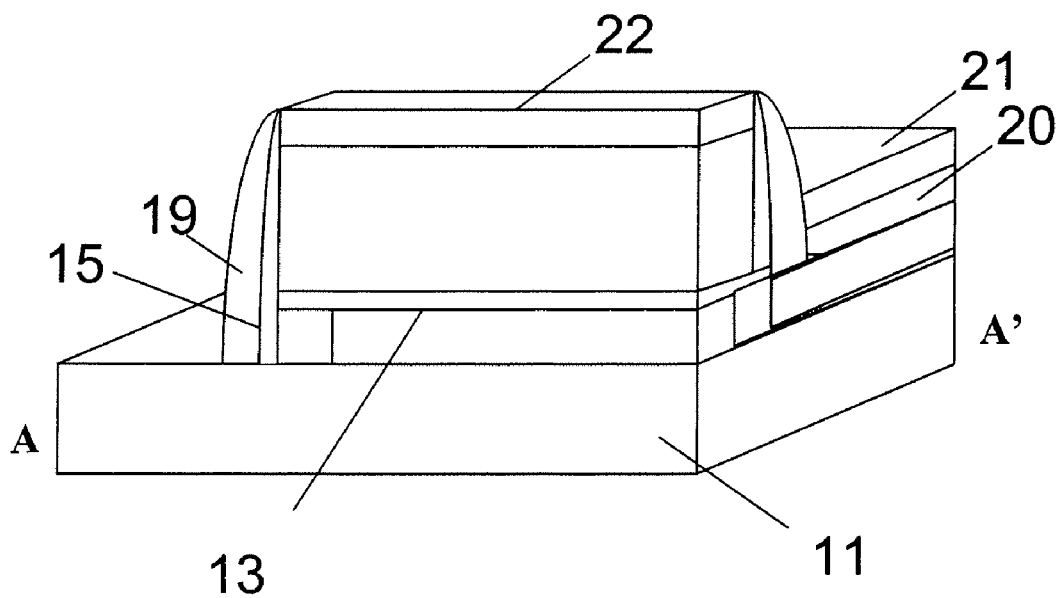
FIG. 6 is a schematic showing a perspective view of the isolated device structure of the present invention at still a further stage of completion.

Afterwards as shown in FIG. 4, an offset spacer 15 (preferably thin with respect to the width of the gate polysilicon layer 14) is formed which covers a sidewall of the gate polysilicon layer 14. The off-set spacer final width is preferably 5-10 nm. After gate patterning, $SiO_2$ or SiN is deposited on the whole wafer surface utilizing, for example low temperature chemical vapor deposition. Next, the off-set spacer on the gate side wall is formed by using conventional blanket reactive ion etching, leaving a portion of the side wall covered and thereby producing the offset spacer 15.

Figure 5A:
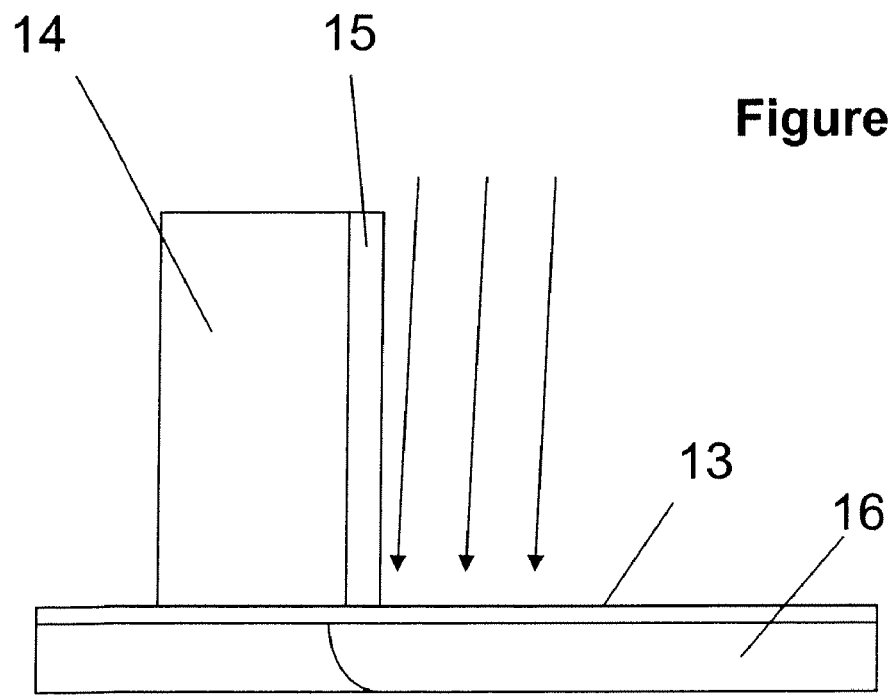
FIGS. 5A-5C are schematics showing ion implantation to form extension, halo, and deep-junction implantation, respectively.
Figure 5B:
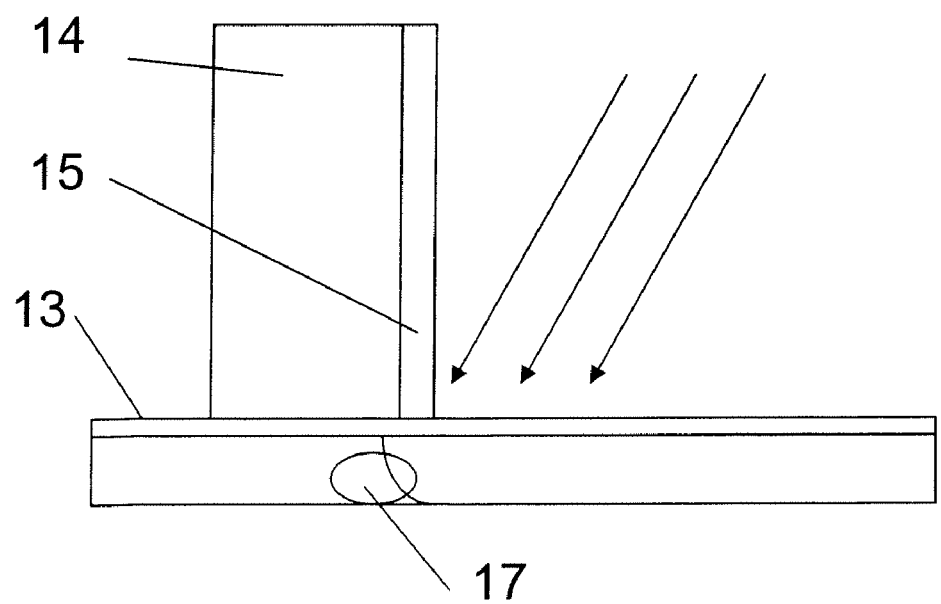
Figure 5C:
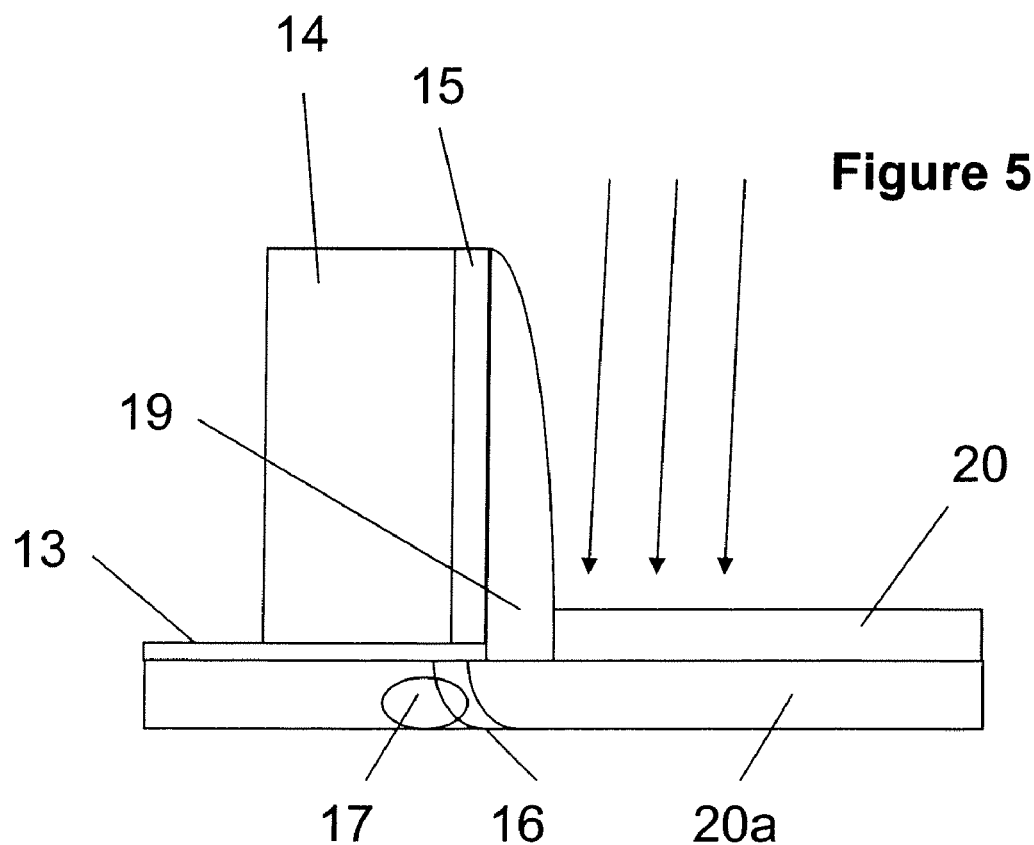

FIGS. 5A-5C are schematics showing ion implantation to form extension, halo, and deep-junction implantations, as to be discussed. Arsenic and boron are implanted over the wafer (illustrated by the arrows) to form an extension region 16 where the offset spacer 15 is used as a mask (FIG. 5A). A halo region 17 is formed in the silicon layer 12 by a halo implant process where the ions are introduced at an angle, as shown in FIG. 5B. Techniques for halo implantation known in the art as described in U.S. Pat. No. 6,630,385, the entire contents of which are incorporated by reference, are suitable halo implantation techniques for the present invention.

In the present invention, impurity concentrations for extension and halo implants are preferably about $10^{21}$ cm$^{-3}$ and $8 \times 10^{18}$ cm$^{-3}$, respectively. Arsenic can be implanted to form the extension region 16 using energy of 1 KeV, angle of 7 degrees and a dose of $10^{15}$ cm$^{-2}$. Boron can be implanted to form the halo region 17 using energy of 10 KeV, angle of 30 degrees and a dose of $8 \times 10^{13}$ cm$^{-2}$. The halo implant can form not only the halo region 17 but also a high concentration region 18 (FIG. 4A) at the active area 2 sidewall by penetrating the offset spacer 15. In the present invention, the halo region 17 suppresses roll-off characteristics to achieve a smaller dimension MOSFET, while the high concentration region 18 relaxes the focused electric field at the STI corner. Accordingly, the high concentration region 18 serves as shallow trench isolation (STI) corner compensation to confine a gate electric field to the channel region.

Gate oxide 13 can be removed during the etching of the off-set spacer 15. Subsequently, an offset spacer 19 (preferably thick in comparison to the offset spacer 15) is formed. The final width of the offset spacer 19 is preferably from 20-50 nm. To form the offset spacer 19, SiN is deposited by a PE-CVD technique. Next, a blanket reactive ion etch is performed that retains the SiN on the gate side wall to form offset spacer 19.

A raised source drain region (RSD) 20 is formed preferably as an epitaxial silicon layer grown from extension region 16. According to the present invention, a RSD thickness is preferably in a range from 20-30 nm. The RSD can be formed for example by a silicon epitaxial layer selectively grown on the exposed source/drain region at the temperature of 700-800° C. Such techniques known in the art and suitable for the present invention are disclosed in IEDM Tech. Dig., 2003, p. 635. Spacer 19 provides separation and further dielectric resistance between the RSD 20 and the gate polysilicon layer 14. The dielectric resistance is limited by the gate oxide at the gate edge because the RSD 20 is electrically connected to the extension. Offset spacer 19 sets a deep junction located far from the gate edge to avoid roll-off degradation by the deep junction encroachment.

Arsenic and/or phosphorus ions are then implanted over the wafer to form a deep junction region 20a in the epitaxial silicon layer 20, as shown in FIG. 5C. Dopant concentrations of about $10^{21}$ cm$^{31\ 3}$ are realized in the deep junction region 20a for example by arsenic implantation using an energy of 10 KeV, angle of 7 degrees, and dose of $3 \times 10^{15}$ cm$^{-2}$.

Figure 7A:
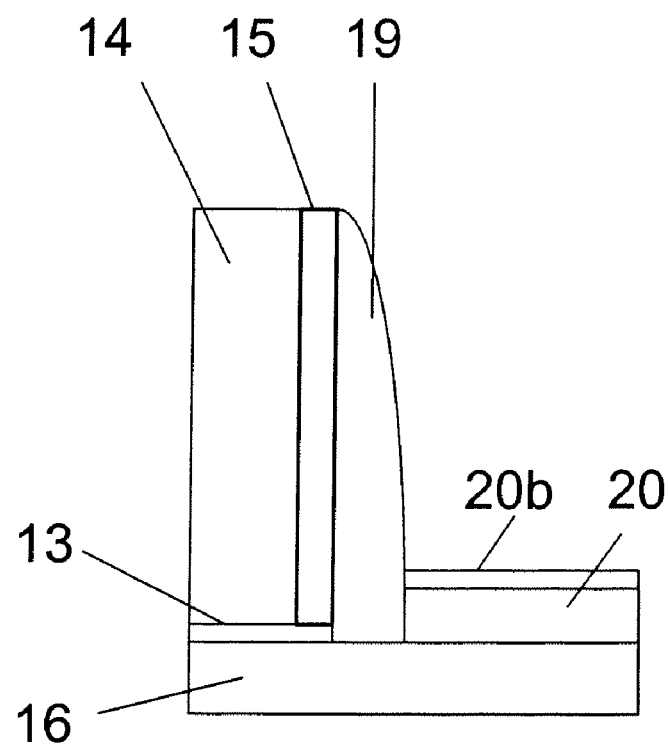
FIGS. 7A-7B are schematics illustrating silicidation.
Figure 7B:
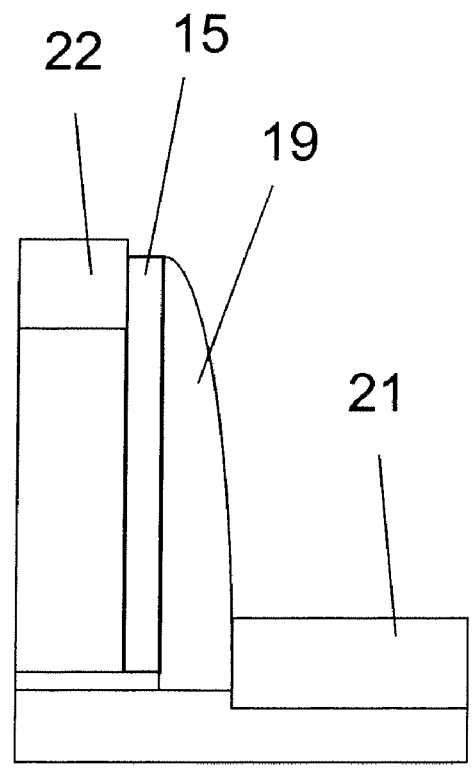

Silicide layers 21 and 22 are subsequently formed on both the epitaxial silicon layer 20 and the gate polysilicon layer 14, respectively using a salicide technique, yielding the structure shown in FIG. 7B. FIGS. 7A-7B are schematics illustrating silicidation. A metal 20b such as Co or Ni is deposited on the whole surface. In one embodiment of the present invention, the thickness of the metal 20b is in a range from 5-10 nm. Metal on the gate polysilicon and metal on the RSD 20 form silicide layers 21 and 22 such as CoSi or NiSi during a silicide anneal. In one embodiment of the present invention, the thickness of the metal on the gate polysilicon and metal on the RSD 20 is in a range from 20-30 nm. Salicide techniques known in the art as described in U.S. Pat. No. 6,255,177, the entire contents of which are incorporated by reference, are suitable for the present invention.

Another role of spacer 19 is the separation between silicide on the gate and silicide on the source/drain. Metal on the spacer 19 remains as metal after the silicide anneal. Metal remaining on the spacer 19 is etched off by wet chemicals to separate the silicide on the gate and the silicide on the source/drain.

Figure 8:
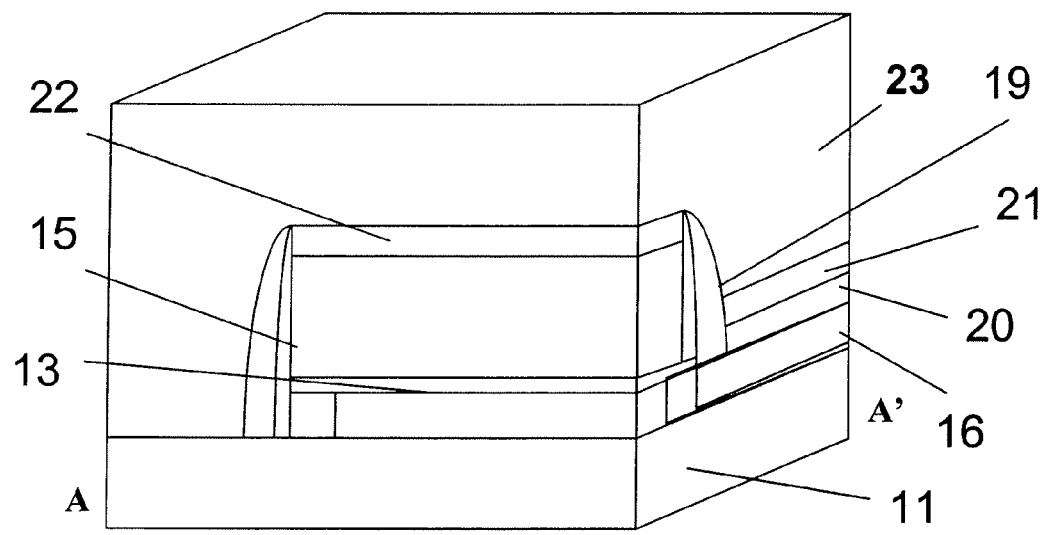
FIG. 8 is a schematic illustration showing the formation of an isolation dielectric of the present invention.

Following the salicide technique, an isolation dielectric 23 such as, for example, an interlayer dielectric layer was deposited over the device and on BOX layer 11 to cover the device, as shown in FIG. 8. Suitable dielectrics for the isolation dielectric 23 include SiO$_2$, Si$_3$N$_4$, silicon oxynitrides, and low k dielectric glasses. Such dielectrics can be deposited for example by chemical vapor deposition. A spin-on glass may also be used. Additionally, plasma enhanced chemical vapor deposition (including high density plasma) processes can be used to deposit the isolation dielectric.

The surface of the silicide layers 21 and 22 and the spacer 19 are thus covered as shown in FIG. 8 with a dielectric film 23. The device 10 is isolated from other devices (not shown). The isolation dielectric 23 protects an interface between the isolation dielectric 23 and the raised source/drain region 20 from inadvertent etching and divot formation, especially if the isolation dielectric 23 is a silicon nitride as noted. A chemical mechanical polishing (CMP) step may be used to planarize the surface of dielectric film 23. Thus, this interface will be protected even when using a subsequent HF process or when using CMP to produce the flat or planarized upper surface as shown in FIG. 8.

Figure 9:
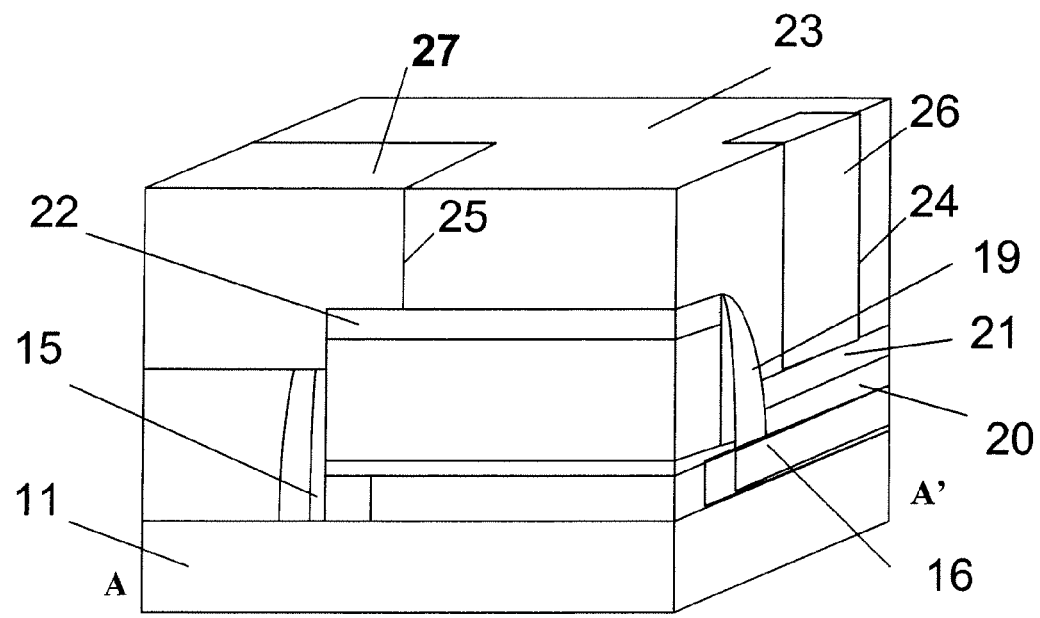
FIG. 9 is a schematic showing a perspective view of the isolated device structure of the present invention at yet a further stage of completion.

Afterwards as shown in FIG. 9, a contact hole 24 and a wire trench 25 are opened in the isolation dielectric 23. Contact hole 24 is preferably etched with a contact mask and trench 25 is preferably etched using a separate metal layer mask. It may be possible to open hole 24 and trench 25 at the same time. Damascene wire techniques known in the art are suitable for the present invention. One such suitable damascene technique is described in Proc. of IITC, 2003, p. 9 which utilizes a Cu/low k damascene interconnect technology.

A high-conductivity metal such as W is deposited in contact hole 24 to form contact plug 26 and in trench 25 to form metallization line or wire 27, preferably at the same time using a dual damascene process to produce the structure shown in FIG. 9. Preferably, in one embodiment of the present invention, a contact metal such as Ti or TiN is formed between the W and the silicide in this embodiment. In other embodiments, Al or Cu with appropriate contact metal and/or barrier metal is used for the wires 27. Other metals may be used, depending upon the application or design considerations. Contact plug 26 is electrically connected to RSD 20 through silicide 21 and line or wire 27 is electrically connected to the gate through silicide 22. Utilization of W metal wire in the present invention reduces wiring resistance dramatically in the resulting device structure.

Figure 10A:
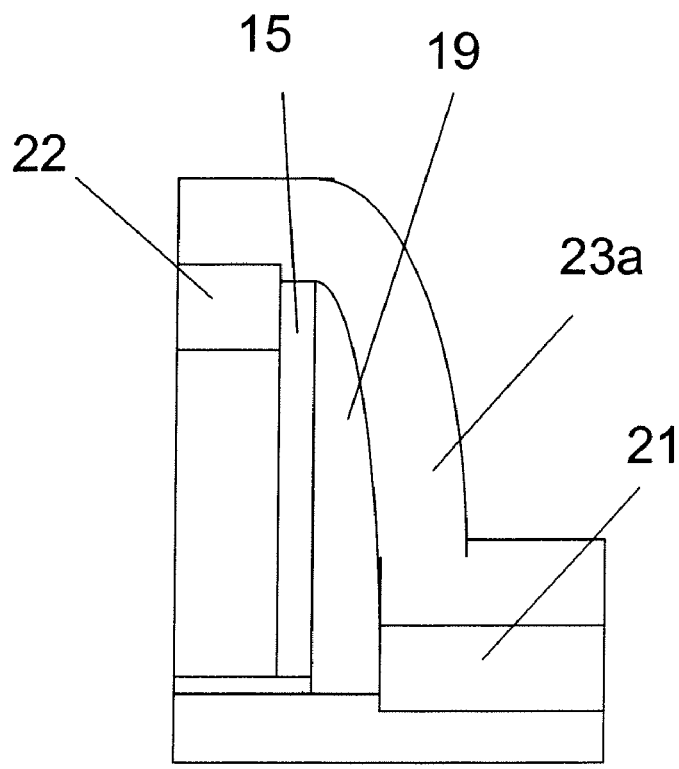
FIGS. 10A-10C are schematics showing formation of an isolation dielectric according to another embodiment of the invention.
Figure 10C:
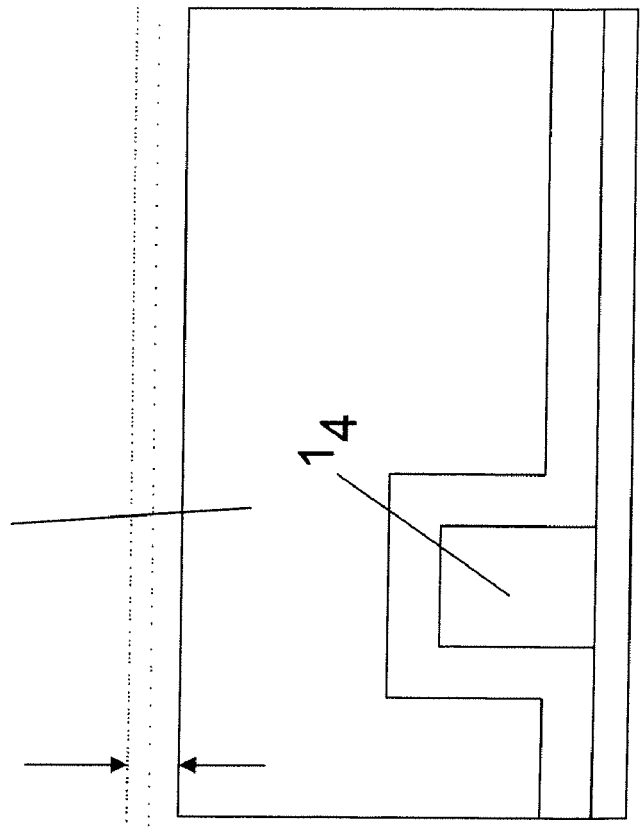
Figure 10B:
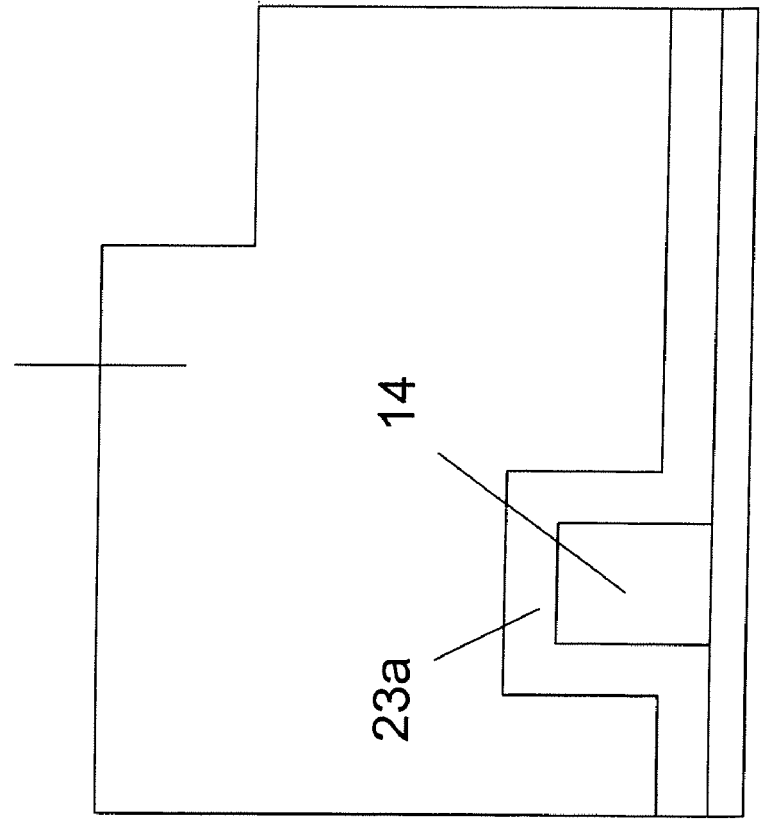

FIGS. 10A-10C illustrate a second embodiment where the isolation dielectric consists of more than more layer. In this example there are two layers. A first isolation dielectric 23a to conformally deposited over the gate electrode 14 and the surface 21a of the source drain regions 20 with a SiN deposition. The isolation dielectric 23a is preferably a silicon nitride having a thickness of at least 40 nm to cover the gate electrode 14 and the surface 21a of the source drain regions 20. In one embodiment of the present invention, the thickness of the isolation dielectric 23a is in a range of 40-100 nm. The isolation dielectric 23b, consisting of one of the materials described above for film 23, can be deposited to a thickness of 500-700 nm over film 23a, as shown in FIG. 10B (other elements of the device are not shown for simplification of explanation). Subsequently, a chemical mechanical polish is used to planarize the resultant surface (FIG. 10C). The difference in the thickness of film 23b after CMP is indicated by the arrows.

In the present invention, no STI divots are formed at in the device. Divot formation is avoided in the present invention, for one reason, since isolation dielectric 23 is formed after the device is formed. It is also possible to have a process free of HF wet processing steps Further, a portion of the isolation device 10 where divots would occur in a normal STI process is covered by the offset spacer 15 and the spacer 19. The spacer 19, for example made of SiN, is resistant to HF etching. Hence, HF steps after spacer formation can occur in the present invention without incurring divot formation, thus allowing RSD techniques to be utilized.

Large lithographic exposure-defocus (ED) windows have also been used for critical dimensioning of device structures, especially for gate patterning. Lithographic exposure-defocus (ED) can be used in the device steps for both active area and gate patterning. However, the surface planarization required for gate patterning is greater than that required for active area patterning. Hence, device structures and device processes which provide planarized surfaces for patterning, especially gate patterning, are desirable in order to produce smaller higher density devices. The present invention provides flat or planarized surfaces for improved gate level lithography.

Further, the resistance-capacitance (RC) time delay is one concern for high end logic devices. To reduce resistances, gate electrode materials have been changed from doped poly-silicon to silicided poly-silicon, and in the future metal gates are expected to be utilized. Devices and processes for the development thereof which are compatible with silicided poly-silicon and metal gates are desirable. Further, compatibility with dual damascene W metal wire for gate level connections is desirable. The present invention is compatible with silicide and metal gate processes, as well as dual damascene W processes.

Chip cost is a concern in the large scale integration (LSI) business. Shorter and simpler processes are desired to reduce chip cost. The present invention provides a simpler and less complicated process.

Numerous modifications and variations of the present invention are possible in light of the above teachings. It is therefore to be understood that within the scope of the appended claims, the invention may be practiced otherwise than as specifically described herein.

What is claimed is:

1. A method for producing a semiconductor device, comprising:
   forming a first silicon region from a silicon formed as a silicon-on-insulator structure;
   forming source and drain regions in said first silicon region;
   forming a gate insulator on said first silicon region and between said source and drain regions;
   forming a gate on said gate insulator;
   forming a sidewall insulating film on a side portion of said gate; and
   forming a device isolation dielectric film on said sidewall insulating film,
   wherein forming said sidewall insulating film comprises:
      forming a first spacer extending from a surface of said insulator, and
      forming a second spacer on said first spacer and extending from a surface of the silicon region.

2. The method as recited in claim 1 further comprising: forming a halo region in said first silicon region.

3. The method as recited in claim 1, further comprising: forming a second silicon region on said first silicon region to form raised source and drain regions.

4. The method as recited in claim 3, further comprising epitaxially growing said second silicon region.

5. The method as recited in claim 4, comprising: forming a silicide on said second silicon region.

6. The method as recited in claim 1, further comprising: forming a region in said silicon and adjacent to at least one of said source and drain regions, said source and drain regions doped with an impurity of said first conductivity type to a first concentration, the region doped with an impurity of said first conductivity type to a second concentration higher than said first concentration.

7. The method as recited in claim 1, further comprising: forming a halo region in said silicon.

8. The method as recited in claim 1, further comprising: planarizing an upper surface of said device isolation dielectric film.

9. The method as recited in claim 8, wherein planarizing said upper surface of said device isolation dielectric film comprises chemical mechanical polishing said upper surface.

10. The method as recited in claim 1, wherein forming said device isolation dielectric film comprises forming a film consisting of at least one of $SiO_2$, $Si_3N_4$, silicon oxynitride, a low k dielectric glass, and a spin-on glass.

11. The method as recited in claim 1, further comprising: forming the gate consisting of one of polysilicon and metal.

12. The method as recited in claim 11, further comprising: forming said gate of polysilicon and forming a silicide on said polysilicon.

13. A method as recited in claim 1, further comprising: forming metallizations connected to said gate and to said source and drain regions.

14. The method as recited in claim 13, wherein forming said metallizations comprises depositing metal with a damascene process.

15. The method as recited in claim 13, wherein forming said metallizations comprises depositing W.

16. The method as recited in claim 1, wherein forming said device isolation dielectric film comprises:
   forming a multilayered dielectric on said insulator.

17. The method as recited in claim 16, wherein the forming a multilayered dielectric comprises:
   forming at least one of a silicon nitride layer and an interlayer dielectric.

18. A method for producing a semiconductor device, comprising:
   forming a first silicon region from a silicon formed as a silicon-on-insulator structure;
   forming a first silicon region from said silicon;
   forming source and drain regions in said first silicon region;
   forming a gate insulator on said first silicon region and between said source and drain regions:
   forming a gate on said gate insulator:
   forming a sidewall insulator on a side portion of said gate; and
   forming a dielectric film on said sidewall insulator,
   wherein forming said sidewall insulator comprises:
      forming a first spacer, said first spacer extending from a surface of said sidewall insulator to said silicon-on-insulator structure, and forming a second spacer on said first spacer, the second spacer extending from a surface of the silicon region to said silicon-on-insulator structure; and forming said dielectric film comprises:
   forming a first dielectric layer on said insulator, and
   forming a second dielectric layer on said first dielectric layer and over said silicon-on-insulator structure.

19. The method as recited in claim 18, further comprising: forming a second silicon region on said first silicon region to form raised source and drain regions.

20. The method as recited in claim 19, further comprising epitaxially growing said second silicon region.

21. The method as recited in claim 19, further comprising: forming a halo region in said first silicon region.

22. The method as recited in claim 19, further comprising: forming a silicide on said second silicon region.

23. The method as recited in claim 18, further comprising: forming a region in said silicon and adjacent to at least one of said source and drain regions, said source and drain regions doped with an impurity of a first conductivity type to a first concentration, the region doped with an impurity of said first conductivity type to a second concentration higher than said first concentration.

24. The method as recited in claim 18, further comprising: planarizing an upper surface of said dielectric film.

25. The method as recited in claim 24, wherein planarizing said upper surface of said dielectric film comprises chemical mechanical polishing said upper surface.

26. The method as recited in claim 18, wherein forming said dielectric film comprises forming a film consisting of at least one of $SiO_2$, $Si_3N_4$, silicon oxynitride, a low k dielectric glass, and a spin-on glass.

27. The method as recited in claim 18, further comprising: forming the gate consisting of one of polysilicon and metal.

28. The method as recited in claim 27, further comprising: forming said gate of polysilicon and depositing a silicide on said polysilicon.

29. The method as recited in claim 18, further comprising: forming metallizations connected to said gate and to said source and drain regions.

30. The method as recited in claim 29, wherein forming said metallizations comprises depositing metal with a damascene process.

31. The method as recited in claim 29, wherein forming said metallizations comprises depositing W.

32. The method as recited in claim 18, wherein forming said dielectric film comprises:
   forming a multilayered dielectric on said insulator, at least one layer of said multilayer dielectric extending from said insulator to cover the silicon-on-insulator structure.

33. The method as recited in claim 32, wherein the forming a multilayered dielectric comprises:
   forming at least one of a silicon nitride layer and an interlayer dielectric.

34. The method as recited in claim 32, further comprising:
   forming a conformal layer on said insulator and over said device; and
   forming a dielectric layer on said conformal layer and over said device.

* * * * *

UNITED STATES PATENT AND TRADEMARK OFFICE
CERTIFICATE OF CORRECTION

PATENT NO. : 7,537,981 B2  
APPLICATION NO. : 11/736232  
DATED : May 26, 2009  
INVENTOR(S) : Kohyama Page 1 of 1

It is certified that error appears in the above-identified patent and that said Letters Patent is hereby corrected as shown below:

On the title page, Item (73), the Assignee's information is incorrect. Item (73) should read:

-- (73) Assignee: Kabushiki Kaisha Toshiba, Tokyo (JP) --

Signed and Sealed this

Fourth Day of August, 2009

JOHN DOLL  
*Acting Director of the United States Patent and Trademark Office*